United States Patent
Liu et al.

(10) Patent No.: US 12,161,037 B2
(45) Date of Patent: Dec. 3, 2024

(54) DISPLAY PANEL INCLUDING MICRO LED PIXEL UNITS IN PART OF DISPLAY AREA

(71) Applicant: WUHAN CHINA STAR OPTOELECTRONICS TECHNOLOGY CO., LTD., Hubei (CN)

(72) Inventors: Fancheng Liu, Hubei (CN); Guowei Zha, Hubei (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 459 days.

(21) Appl. No.: 16/623,722

(22) PCT Filed: Nov. 11, 2019

(86) PCT No.: PCT/CN2019/117065
§ 371 (c)(1),
(2) Date: Sep. 25, 2021

(87) PCT Pub. No.: WO2021/017276
PCT Pub. Date: Feb. 4, 2021

(65) Prior Publication Data
US 2022/0013597 A1    Jan. 13, 2022

(30) Foreign Application Priority Data
Jul. 29, 2019    (CN) .......................... 201910691367.5

(51) Int. Cl.
*H10K 59/121*    (2023.01)
*H10K 59/35*    (2023.01)
*H10K 59/65*    (2023.01)

(52) U.S. Cl.
CPC ......... *H10K 59/353* (2023.02); *H10K 59/121* (2023.02); *H10K 59/65* (2023.02)

(58) Field of Classification Search
CPC ..... H10K 59/353; H10K 59/65; H10K 59/121
See application file for complete search history.

(56) References Cited

U.S. PATENT DOCUMENTS

| | | |
|---|---|---|
| 10,756,136 B1 | 8/2020 | Ma et al. |
| 2017/0179092 A1 | 6/2017 | Sasaki et al. |

FOREIGN PATENT DOCUMENTS

| | | |
|---|---|---|
| CN | 108986678 A | 12/2018 |
| CN | 109935173 A | 6/2019 |

(Continued)

OTHER PUBLICATIONS

Machine Translation of IDS Reference CN 11003415A, published Jul. 19, 2019.*

*Primary Examiner* — Suberr L Chi
(74) *Attorney, Agent, or Firm* — Geoffrey Lottenberg; Berger Singerman LLP

(57) ABSTRACT

A display panel disposes a first display area and a second display area. The display panel includes a plurality of OLED pixel units disposed in the first display area, and a plurality of Micro LED pixel units disposed in the second display area. By replacing the OLED pixel units corresponding to the under-screen camera or used to display a fixed picture with the Micro LED pixel units, the image quality of an under-screen camera can be improved, and the burning screen problem caused by displaying the same picture for a long time can be solved.

8 Claims, 7 Drawing Sheets

(56) References Cited

FOREIGN PATENT DOCUMENTS

| CN | 109950288 A | 6/2019 |
| CN | 110034151 A | 7/2019 |
| CN | 110061014 A | 7/2019 |

\* cited by examiner

DISPLAY PANEL INCLUDING MICRO LED PIXEL UNITS IN PART OF DISPLAY AREA

CROSS-REFERENCE TO RELATED APPLICATIONS

This application is the National phase under 35 U.S.C. § 371 of International Application No. PCT/CN2019/117065, filed Nov. 11, 2019, which claims the benefit of and priority to Chinese Patent Application No. 201910691367.5, filed Jul. 29, 2019. The entire contents of these patent applications are hereby incorporated by reference herein.

BACKGROUND OF THE INVENTION

1. Field of the Invention

The present invention relates to a display technical field, and more particularly to a display panel.

2. Description of the Prior Art

With the rapid development of display technology, the pursuit of high screen proportion has become the mainstream of the display industry. At present, the technologies of under-screen fingerprint and under-screen camera are all designed to achieve touch or camera functions without affecting display. For a full screen design scheme with consideration of display in the under-screen camera, OLED (Organic Light-Emitting Diode) has natural advantages over LCD (liquid crystal display). However, OLED is also limited by its pixel structure, sub-pixels can not be more refined, so it will affect the overall transmittance of the camera on the screen, and ultimately affect the camera imaging quality.

In addition, when the display screen of the mobile phone is working, some fixed icons, such as time, signal and message notification, will be generally displayed for a long time at the top of the display screen. Or, when using the application software, the top of the display screen will display fixed head, etc. The OLED display screen uses organic light. If the fixed screen is displayed for a long time, it may burn the machine and cause bad residual shadow in the fixed position.

BRIEF SUMMARY OF THE INVENTION

The present invention is to provide a display panel, which can solve the technical problems that a pixel unit of the existing OLED display panel uses organic substances to emit light, and a long time display of the same picture can easily lead to the risk of burning the screen, a low transmittance of the OLED pixel unit will reduce the lighting effect at the under-screen camera, affect the image quality of the camera, and then affect the technical problems of display.

To solve the above technical problems, the present invention provides the following technical scheme.

The present invention provides a display panel. The display panel disposes a first display area and a second display area. The display panel includes a first array substrate, a plurality of OLED pixel units and a plurality of Micro LED pixel units. The plurality of OLED pixel units are arranged on the first array substrate in array and disposed in the first display area. The plurality of Micro LED pixel units are disposed in the second display area in array. Each Micro LED pixel unit includes a light emitting region and a light transparent region, and an area of the light transparent region is greater than or equal to that of the light emitting region. The first display area has an opening. Orthographic projections of the plurality of the Micro LED pixel units on the first array substrate are located within the opening.

In at least one embodiment of the present invention, the display panel further includes an optical electronic element disposed away from a light emitting side of the display panel, and an orthographic projection of the optical electronic element on the first array substrate is located within the opening.

In at least one embodiment of the present invention, the plurality of the Micro LED pixel units are located in the opening.

In at least one embodiment of the present invention, the plurality of the Micro LED pixel units are located over or under the opening.

In at least one embodiment of the present invention, the display panel includes a second array substrate, and the plurality of the Micro LED pixel units are disposed on the second array substrate.

In at least one embodiment of the present invention, a touch control layer is disposed on one side of the second array substrate away from the Micro LED pixel units.

In at least one embodiment of the present invention, an adhesive layer is disposed between the first array substrate with the OLED pixel units and the second array substrate with the Micro LED pixel units.

The present invention also provides a display panel. The display panel disposes a first display area and a second display area. The display panel includes a first array substrate, a plurality of OLED pixel units and a plurality of Micro LED pixel units. The plurality of OLED pixel units are arranged on the first array substrate in array and being disposed in the first display area. The plurality of Micro LED pixel units are disposed in the second display area in array. Each Micro LED pixel unit includes a light emitting region and a light transparent region.

In at least one embodiment of the present invention, the second display area is located over or under the first display area.

In at least one embodiment of the present invention, the first display area has an opening, and orthographic projections of the plurality of the Micro LED pixel units on the first array substrate are located within the opening.

In at least one embodiment of the present invention, the display panel further includes an optical electronic element disposed away from a light emitting side of the display panel, and an orthographic projection of the optical electronic element on the first array substrate is located within the opening.

In at least one embodiment of the present invention, the plurality of the Micro LED pixel units are located in the opening.

In at least one embodiment of the present invention, the plurality of the Micro LED pixel units are located over or under the opening.

In at least one embodiment of the present invention, the display panel further includes a second array substrate, and the plurality of the Micro LED pixel units are disposed on the second array substrate.

In at least one embodiment of the present invention, a touch control layer is disposed on one side of the second array substrate away from the Micro LED pixel units.

In at least one embodiment of the present invention, an adhesive layer is disposed between the first array substrate with the OLED pixel units and the second array substrate with the Micro LED pixel units.

In at least one embodiment of the present invention, in one Micro LED pixel unit, an area of the light transparent region is greater than or equal to that of the light emitting region.

The beneficial effect of the present invention is that: by replacing the OLED pixel units corresponding to the under-screen camera with the Micro LED pixel units, it is good for the camera lighting and the image quality of the under-screen camera can be improved. Further, because the OLED pixel units used to display a fixed picture are replaced with the Micro LED pixel units, the burning screen problem caused by displaying the same picture for a long time can be solved.

BRIEF DESCRIPTION OF THE DRAWINGS

For more clearly illustrating the technical scheme in the embodiment or the prior art, the following text will briefly introduce the accompanying drawings used in the embodiment or the prior art. It is obvious that the accompanying drawings in the following description are only some embodiments of the present invention. For the technical personnel of the field, other drawings can also be obtained from these drawings without paying creative work.

DETAILED DESCRIPTION OF THE PREFERRED EMBODIMENTS

The following embodiments are illustrated with reference to the accompanying drawings to illustrate specific embodiments of the present invention that can be implemented. Directional terms mentioned in the present invention, such as "top", "bottom", "front", "back", "left", "right", "inner", "outer", "side" etc., are only used with reference to the orientation of the accompanying drawings. Therefore, the directional terms used herein are intended to illustrate, but not to limit, the present invention. In the figure, units with similar structures are represented by the same label.

The present invention improves the existing display panel. Because a pixel unit of the existing OLED display panel uses organic substances to emit light, a long time display of the same picture can easily lead to the risk of burning the screen, a low transmittance of the OLED pixel unit will reduce the lighting effect at an under-screen camera, affect the image quality of the camera, and further affect the technical problems of display. The embodiment can solve the defect.

Figure 1:
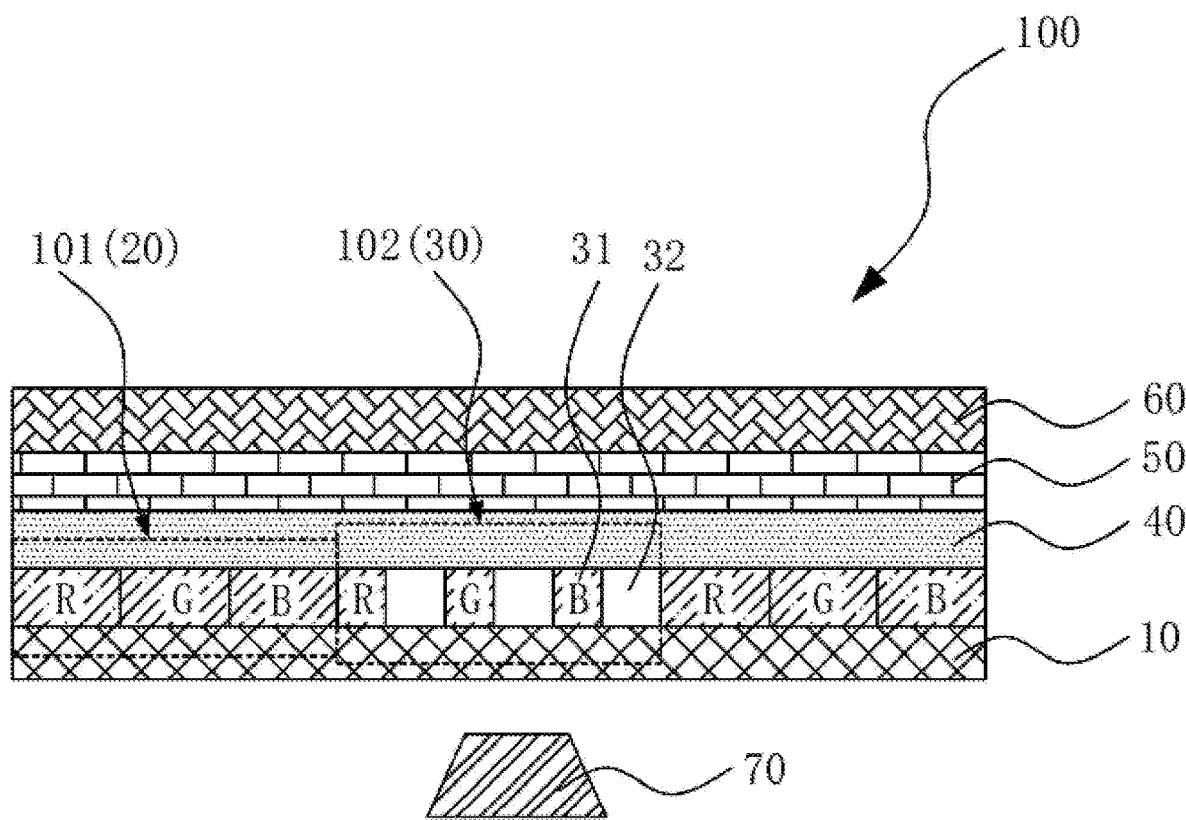
FIG. 1 is a schematic view of a display panel of one embodiment of the present invention.
Figure 2:
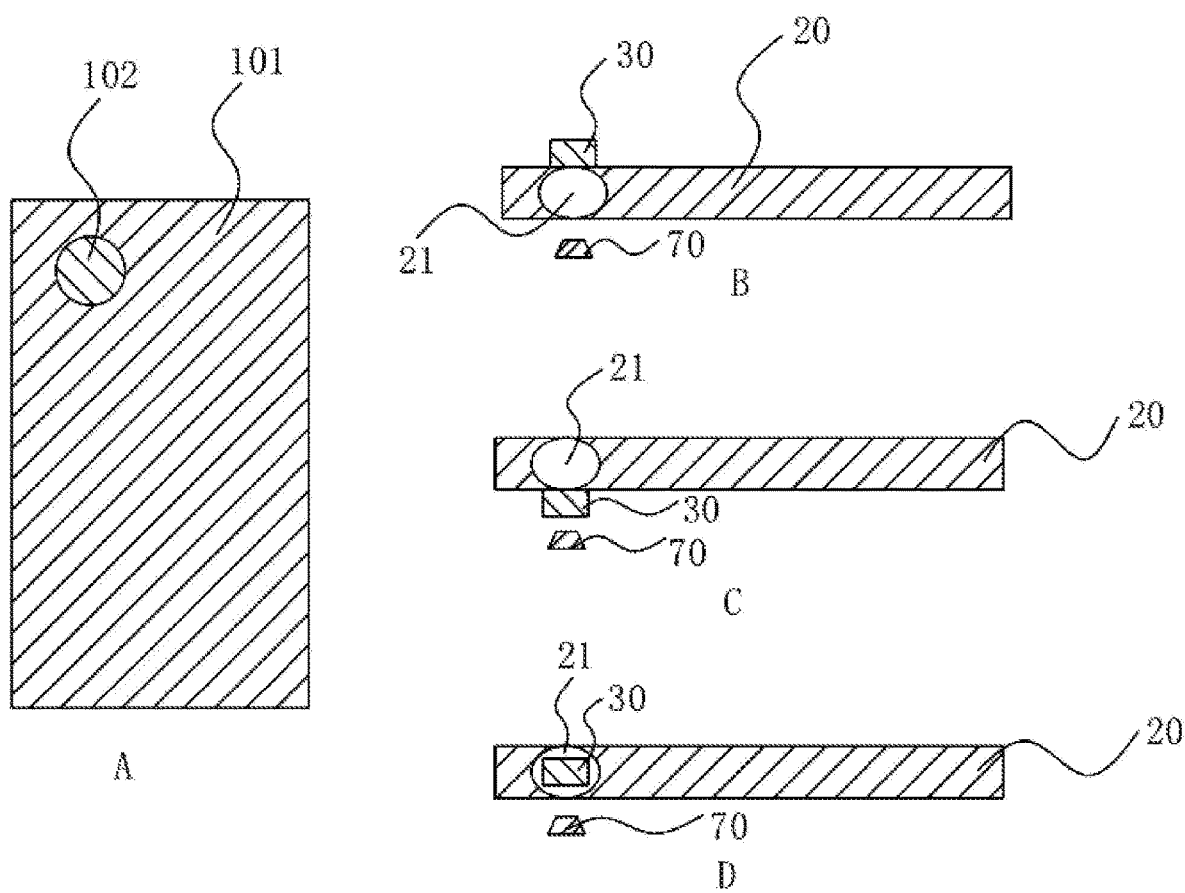
FIG. 2 is a schematic view of a first display area and a second display area of one embodiment of the present invention.

Referring to FIGS. 1 and 2, one embodiment of the present invention provides a display panel 100, which disposes a first display area 101 and a second display area 102. The first display area 101 is provided with a plurality of OLED pixel units arranged in array. The second display area 102 is provided with a plurality of Micro LED pixel units arranged in array.

The existing technology maximizes the screen proportion by placing a front-facing camera into the display screen. However, for an OLED display panel, due to the existing technology, a sub-pixel structure can not be more refined, which will affect the overall transmittance on the under-screen camera. In this embodiment, an OLED pixel area corresponding to the camera is improved. Specifically, the OLED pixel units in the OLED pixel area corresponding to the camera are replaced by the Micro LED pixels, so as to solve the lighting problem on the under-screen camera. Compared with OLED, Micro LED has similar main luminescence characteristics, and inorganic LED has the advantages of stability, high efficiency, long life, high brightness and small size. Therefore, the Micro LED pixel units can replace the OLED pixel units in a small range, and the display panel can obtain better overall screen display effect by making the Micro LED pixel units combine with the OLED pixel units.

Referring to FIG. 2, a part A in FIG. 2 is a top view of the first display area 101 and the second display area 102. Parts B, C and D in FIG. 2 are section views of three Micro LED pixel units in different film layers.

The OLED pixel units 20 and the Micro LED pixel units 30 are disposed on a first array substrate 10. The first array substrate 10 can drive the OLED pixel units 20 and the Micro LED pixel units 30.

The first array substrate 10 includes a substrate and a thin film transistor array disposed on the substrate.

The display panel includes an optical electronic element 70, which is disposed away from a light emitting side of the display panel 100, namely disposed on the back of the display panel 100. The optical electronic element 70 is corresponding to the second display area 102. The orthographic projection of the optical electronic element 70 on the first array substrate 10 is located within an opening 21.

The optical electronic element 70 can be an under-screen camera, an under-screen optical fingerprint identification sensor, an under-screen optical face recognition sensor, an under-screen optical distance sensor, etc., but can not be limited to this.

The first display area 101 has one opening 21. The Micro LED pixel units 30 are disposed in the opening 21. The opening is corresponding to the optical electronic element 70. In a thickness direction of the display panel 100, the second display area 102 is corresponding to the opening 21. The first display area 101 and the second display area 102 are complementary each other to achieve seamless docking, thus completing the whole picture display together.

Figure 3:
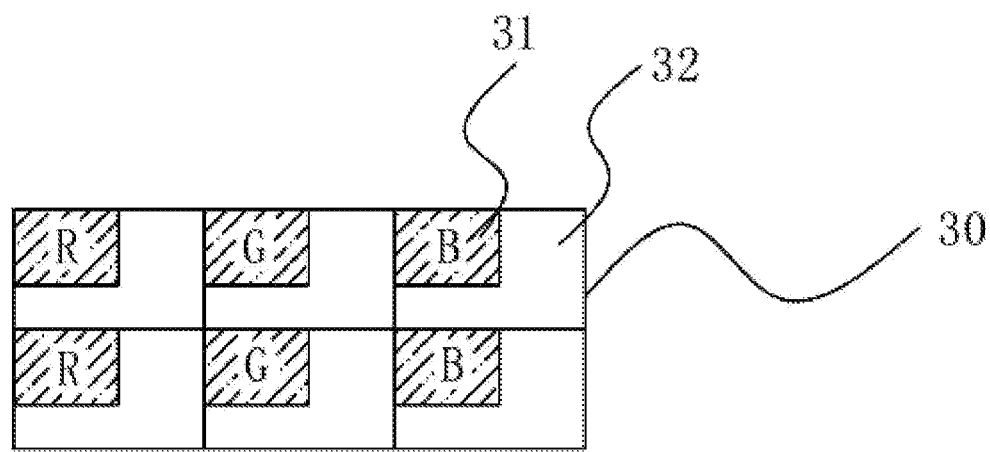
FIG. 3 is a top view of a Micro LED pixel unit of one embodiment of the present invention.

Referring to FIG. 3, each Micro LED pixel unit 30 includes a light emitting region 31 and a light transparent region 32. The light emitting region 31 can be used as an area for setting Micro LED chips. The light transparent region 32 is a transparent display area. Because the Micro LED chip has a small area, a minimum size of the Micro LED chip can achieve a width greater than 1 um at present. Generally, the pixel size of a full high-definition display is 25*65 micron, and the width of the Micro LED pixel unit 30 is 10-1000 microns, so the Micro LED pixel unit 30 can reserve a higher opening rate than the OLED Pixel unit, and can reserve a large blank area for lighting of the optical electronic component 70 such as a camera.

When the Micro LED pixel units 30 works, the second display area can display normally. At any time of display, an image can be collected through the light transparent region 32 and can enter into the optical electronic element 70 under the display panel 100, thus realizing various kinds of under-screen sensing designs, such as under-screen fingerprint identification, under-screen camera, under-screen face recognition, under-screen distance sensing, etc.

In order to ensure an adequate lighting area of the optical electronic element 70, the area of the light transparent region 32 in the Micro LED pixel unit 30 shall be greater than or equal to that of the light emitting region 31. That is, the area of the light transparent region 32 is at least 50% of the area of the Micro LED pixel unit 30.

The Micro LED pixel unit 30 includes R pixel, G pixel and B pixel. Or a blue Micro LED can also be converted to color lights by a color conversion material. FIG. 1 illustrates an example with one Micro LED pixel unit 30.

Each OLED pixel unit 20 includes R pixel, G pixel and B pixel. In other embodiments, a white light can also be converted to color lights by a color conversion way. There is no restriction here.

The display panel 100 may be a touch display panel. A touch control layer 50 is disposed on the OLED pixel units 20 and the Micro LED pixel units 30. The touch control layer 50 is prepared on a substrate, and then the touch control layer 50 is attached to the first array substrate 10 provided with the OLED pixel units 20 and the Micro LED pixel units. Wherein, the touch control layer 50 is attached to the first array substrate 10 by an adhesive layer 40. The adhesive layer 40 is an OCA adhesive. Specifically, the OCA adhesive is disposed on one substrate, and then the substrate is attached to another substrate.

The OLED pixel units 20 can be covered with an encapsulation layer (not shown in the figure) to isolate water and oxygen.

A polarizer 60 is disposed on the touch control layer 50. The polarizer 60 is located on an outermost layer of the display panel 100 to prevent the external light from passing by a cathode metal of the OLED pixel unit and then being reflected back to affect contrast.

In the embodiment, the Micro LED pixel units 30 are built into the OLED pixel units 20. In other embodiments, the Micro LED pixel units 30 can be externally mounted. For example, the Micro LED pixel units 30 can be arranged over the opening 21 or under the opening 21, and the orthographic projections of the Micro LED pixel units 30 on the first array substrate 10 are located within the opening 21.

Figure 4:
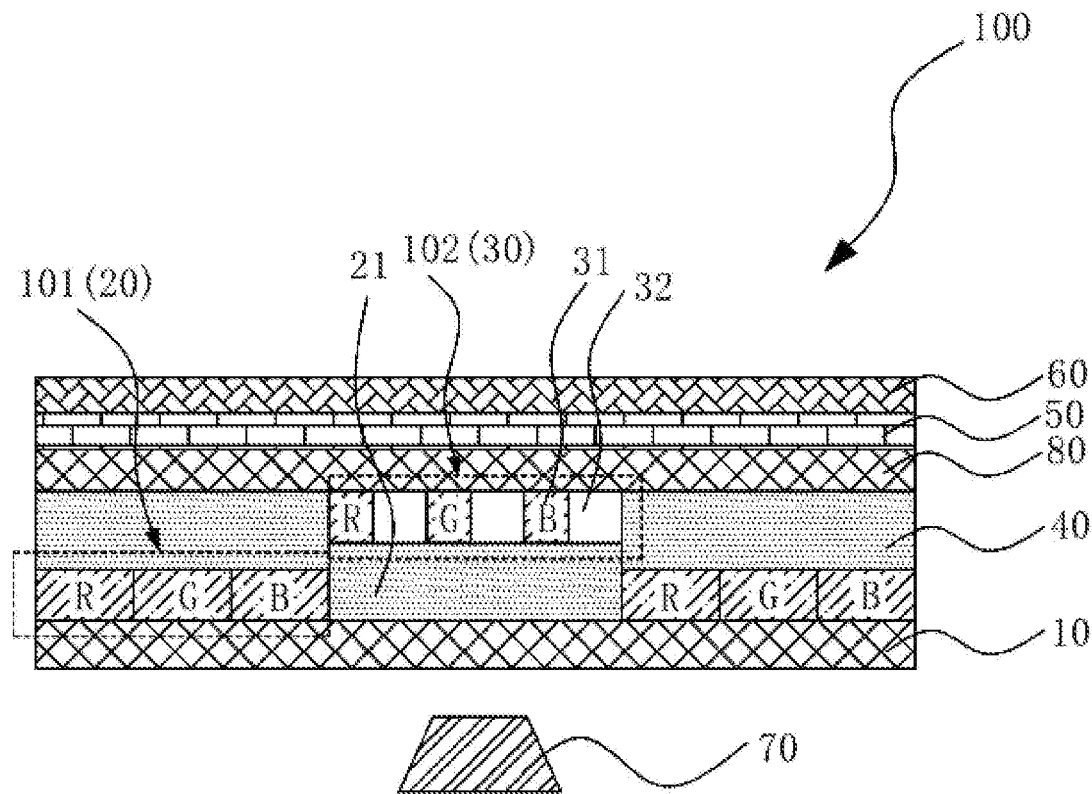
FIGS. 4 to 8 are schematic views of other embodiments of the present invention.

Please refer to a part B of FIG. 2 and FIG. 4, on the basis of the embodiment, the second display area 102 can be set above the first display area 101. That is, the Micro LED pixel units 30 are disposed near a light emitting side of the OLED pixel units 20.

The Micro LED pixel units 30 and the touch control layer 50 can be arranged on opposite sides of the same substrate, respectively. The substrate is called a second array substrate 80, which is used to drive the Micro LED pixel units 30.

Specifically, a plurality of Micro LED chip arrays are disposed on one side of the second array substrate 80 to form the Micro LED pixel units 30. The Micro LED chip arrays are corresponding to the opening 21. The touch control layer 50 is disposed on the other side of the second array substrate 80. Then, one side of the second array substrate 80 with the Micro LED pixel units 30 is attached to one side of the first array substrate 10 with the OLED pixel units 20, so the Micro LED pixel units 30 are located between the touch control layer 50 and the OLED pixel units 20.

Figure 5:
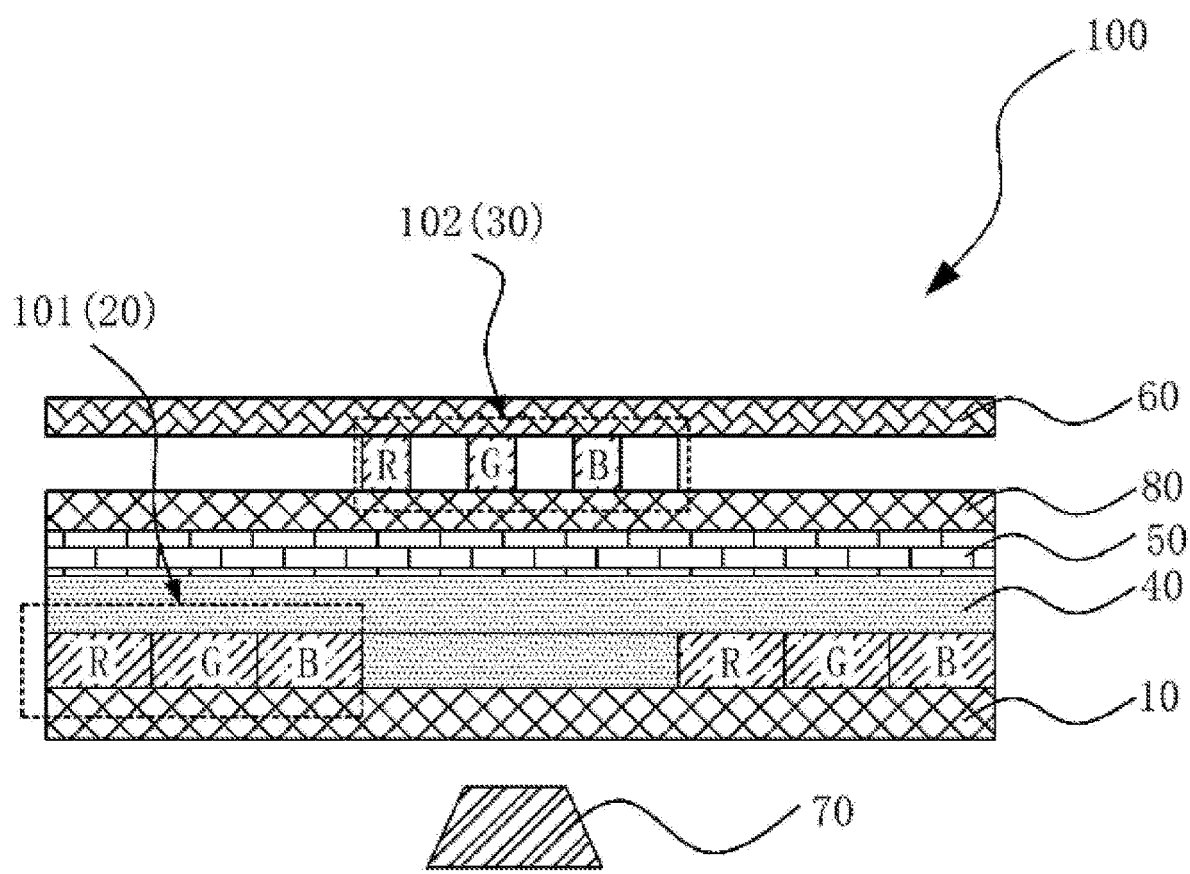

Referring to FIG. 5, in other embodiments, one side of the second array substrate 80 with the touch control layer 50 is attached to one side of the first array substrate 10 with the OLED pixel units 20, so the touch control layer 50 is disposed between the Micro LED pixel units 30 and the OLED pixel units 20.

Figure 6:
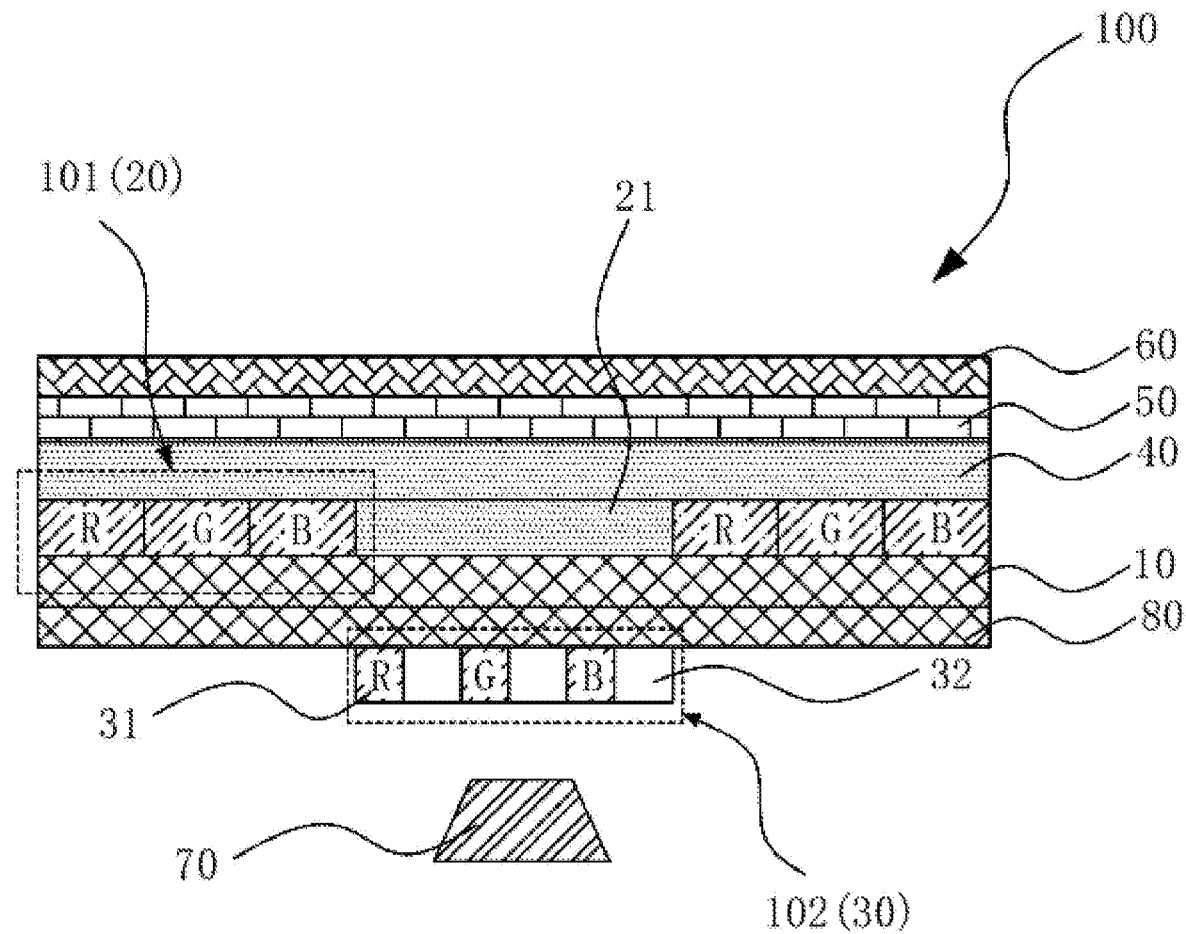

Please refer to a part C of FIG. 2 and FIG. 6, on the basis of the embodiment, the second display area 102 can be disposed under the first display area 101. The Micro LED pixel units 30 are located on one side of the first array substrate 10 away from the OLED pixel units 20, and are corresponding to the opening 21. The orthographic projection of the Micro LED pixel units 30 on the first array substrate 10 is located within the opening 21.

Wherein, the Micro LED pixel units 30 are disposed on the second array substrate 80. The first array substrate 10 and the second array substrate 80 can drive the OLED pixel units 20 and the Micro LED pixel units 30, respectively.

Referring to FIG. 6, when the Micro LED pixel units 30 are disposed on one side of the second array substrate 80 away from the first array substrate 10, the first array substrate 10 and the second array substrate 80 may share one same substrate, so the thin film transistor array of the first and second array substrates 10, 80 can be disposed on two sides of the substrate.

When the Micro LED pixel units 30 are disposed on one side of the second array substrate 80 near the first array substrate 10, the first array substrate 10 and the second array substrate 80 are adhered together by the OCA adhesive.

Figure 7:
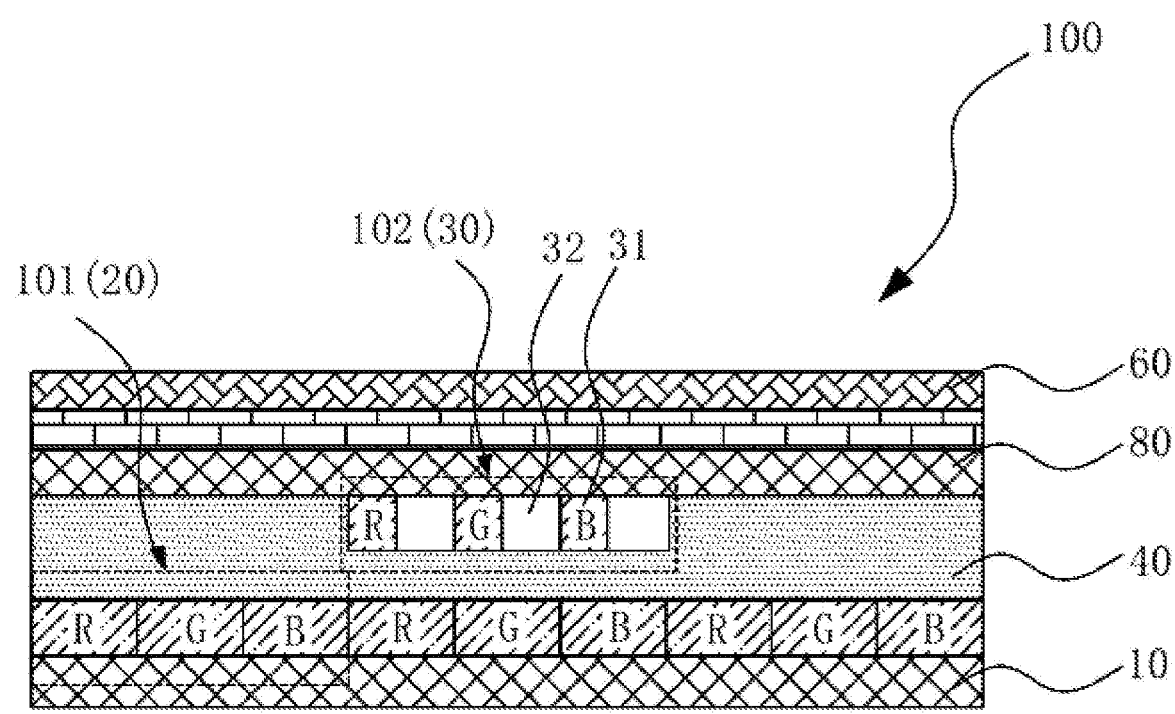

Referring to FIG. 7, on the basis of the embodiment, the first display area 101 has no opening. The orthographic projection of the first display area 101 on the first array substrate 10 coincides with the entire display area of the display panel 100. The second display area 102 is disposed on a light emitting side of the first display area 101 (above the first display area 101), and is located in the area of the display panel 100 for displaying a fixed picture for a long time. When displaying a fixed picture for a long time, the Micro LED pixel units are used to replace the OLED pixel units to solve the problem of burning the screen caused by OLED lighting for a long time.

When the second display area 102 displays a dynamic picture, the Micro LED pixel units 30 do not work, but the OLED pixel units 20 covered by the Micro LED pixel units 30 work. When the second display area 102 displays a fixed picture, such as displaying time and date after the screen is locked, and displaying the header and logo when the application is opened, the Micro LED pixel units 30 work, but the OLED pixel units 20 covered by the Micro LED pixel units 30 do not work.

Because the Micro LED pixel units 30 have a high light penetration rate, the OLED pixel units 20 covered by the Micro LED pixel units 30 are less affected during display.

Figure 8:
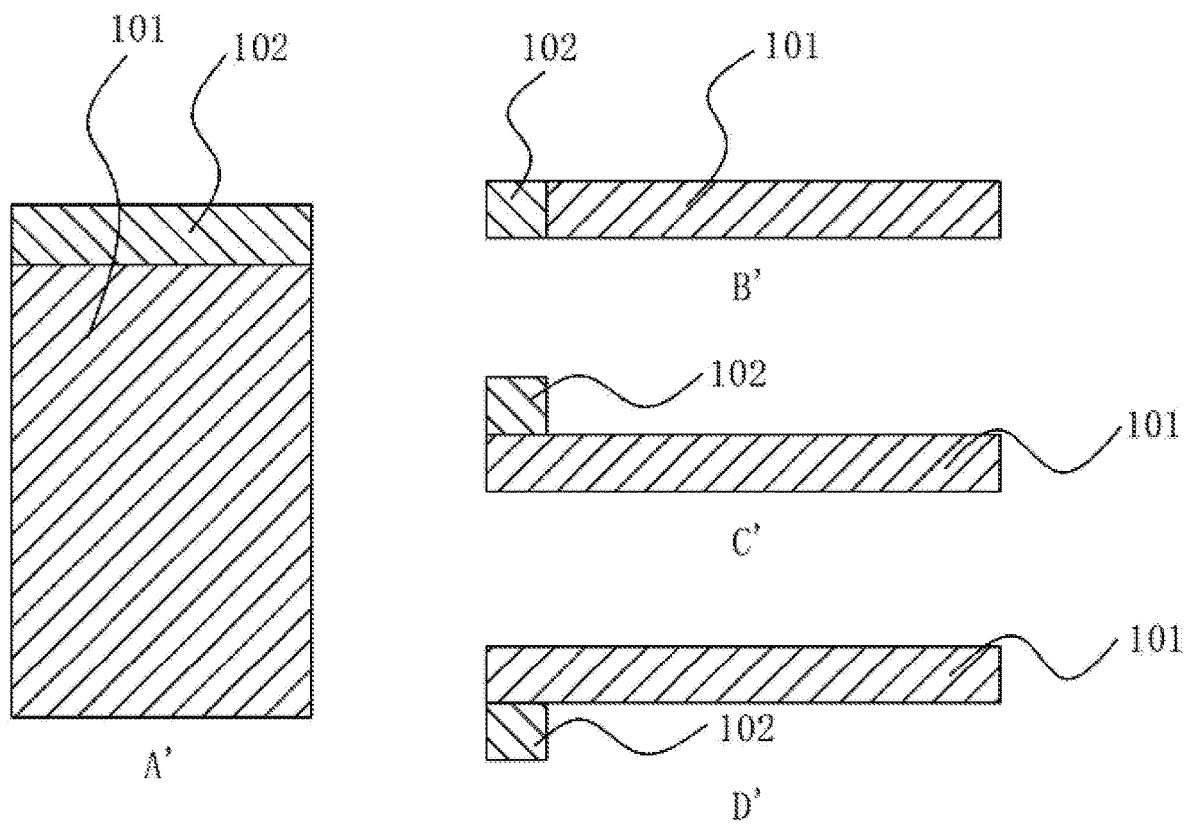

Referring to a part A' of FIG. 8, the second display area 102 is disposed in an upper border area of the display panel 100, and the Micro LED pixel units 30 are used to display the time, date, the header, logo of the application and so on for a long time.

Referring to parts C' and D' of FIG. 8, in addition to setting the second display area 102 above the first display area 101, the second display area 102 can also be set below the first display area 101. The specific layer structure can refer to the above embodiment, and it will not be repeated here.

Referring to a part B' of FIG. 8, in other embodiments, the second display area 102 and the first display area 101 can be spliced for display. The second display area 102 and the first display area 101 have no overlapping surfaces in a thickness direction of the display panel 100, and the sum of the orthographic projections of the first display area 101 and the second display area 102 on the first array substrate 10 completely coincides with the whole display area of the display panel 100. Because the second display area 102 and the first display area 101 are seamlessly connected, there will be no visual interruption or discontinuous boundary of the display, thus achieving a full screen design.

Moreover, since Micro LED has the characteristics of high brightness and long life, one part of the Micro LED pixel units 30 in the second display area 102 can be used as a supplementary light and an indicator light.

It can be understood that the second display area 102 can be disposed in either the area corresponding to the optical electronic element 70 or the area displaying a fixed picture for a long time, or both designs can be considered. The specific structure can be designed according to actual needs.

The beneficial effect: by replacing the OLED pixel units corresponding to the under-screen camera with the Micro LED pixel units, it is good for the camera lighting and the image quality of the under-screen camera can be improved. Further, because the OLED pixel units used to display a fixed picture are replaced with the Micro LED pixel units, the burning screen problem caused by displaying the same picture for a long time can be solved.

In summary, although the present invention has been disclosed in the preferred embodiments as described above, the preferred embodiments mentioned above are not intended to limit the invention. The ordinary technicians in the field can make various modifications and embellishments without departing from the spirit and scope of the present invention, so the scope of protection of the present invention is based on the scope defined by the claims.

What is claimed is:

1. A display panel comprising:
a first array substrate;
a plurality of OLED pixel units, being arranged on the first array substrate in array and being disposed in an entire display area of the display panel;
a second array substrate, overlapped with the first array substrate in a thickness direction of the display panel; and
a plurality of Micro LED pixel units, being arranged on a surface of the second array substrate in array and overlapped with a portion of the plurality of OLED pixel units in the thickness direction of the display panel; each of the Micro LED pixel units including a light emitting region and a light transparent region.

2. The display panel as claimed in claim 1, wherein the display panel further includes an optical electronic element disposed away from a light emitting side of the display panel, and overlapped with plurality of Micro LED pixel units in the thickness direction of the display panel.

3. The display panel as claimed in claim 1, wherein a touch control layer is disposed on one side of the second array substrate away from the Micro LED pixel units.

4. The display panel as claimed in claim 3, wherein an adhesive layer is disposed between the first array substrate with the OLED pixel units and the second array substrate with the Micro LED pixel units.

5. The display panel as claimed in claim 1, wherein in each of the Micro LED pixel units, an area of the light transparent region is greater than or equal to that of the light emitting region.

6. The display panel as claimed in claim 1, wherein the second array substrate is disposed above the first array substrate and the plurality of OLED pixel units.

7. The display panel as claimed in claim 1, wherein the plurality of Micro LED pixel units is disposed above the plurality of OLED pixel units.

8. The display panel as claimed in claim 1, wherein the plurality of Micro LED pixel units is disposed below the plurality of OLED pixel units.

* * * * *